(12) United States Patent
Yoon et al.

(10) Patent No.: US 6,391,227 B1
(45) Date of Patent: May 21, 2002

(54) GLASS PLATE HAVING ELECTRICALLY CHARGE-PREVENTIVE FILM OF CONDUCTIVE ORGANIC POLYMER, ITS MAKING METHOD, A SOLUTION FOR MAKING THE FILM, AND ITS MANUFACTURING METHOD

(75) Inventors: Sang Youl Yoon; Chang Han Lee; Ho Seok Shon, all of Kyungsangbuk-do (KR)

(73) Assignee: Orion Electric Co., Ltd., Kyungsangbuk-do (KR)

( * ) Notice: Subject to any disclaimer, the term of this patent is extended or adjusted under 35 U.S.C. 154(b) by 0 days.

(21) Appl. No.: 09/554,233
(22) PCT Filed: Sep. 22, 1999
(86) PCT No.: PCT/KR99/00573
 § 371 Date: Jul. 14, 2000
 § 102(e) Date: Jul. 14, 2000
(87) PCT Pub. No.: WO00/17119
 PCT Pub. Date: Mar. 30, 2000

(30) Foreign Application Priority Data

Sep. 22, 1998 (KR) .............................................. 98-39194
May 19, 1999 (KR) .............................................. 99-18148

(51) Int. Cl.$^7$ ............................. A01B 1/12; C03C 17/42; H01J 5/08
(52) U.S. Cl. ................. 252/500; 427/393.1; 428/312.6; 428/317.7; 428/426; 428/922
(58) Field of Search ........................... 428/312.6, 317.7, 428/426, 922; 252/500; 427/393.1

(56) References Cited

U.S. PATENT DOCUMENTS

| | | | | |
|---|---|---|---|---|
| 5,291,097 A | * | 3/1994 | Kawamura et al. | 313/478 |
| 5,742,119 A | * | 4/1998 | Aben et al. | 313/479 |
| 5,750,054 A | * | 5/1998 | Cinquina et al. | 252/500 |
| 5,773,150 A | * | 6/1998 | Tong et al. | 428/429 |

* cited by examiner

Primary Examiner—Mark Kopec
(74) Attorney, Agent, or Firm—Notaro & Michalos P.C.

(57) ABSTRACT

A glass plate having high-electroconductive film which can be formed using electroconductive organic polyrmer in a simple method and at a low cost, and having an improved anti-static characteristic with a strong film hardness and a strong adhesive strength. The glass plate has an anti-static film (10, 20) formed on the exterior surface, the film comprising a first coating layer (11, 21) formed containing an electroconductive organic polymeric component and a second coating layer (12, 22) of silica coating formed by being overcoated onto the first coating layer (11, 21). The electroconductive organic polymeric solution contains 0.005–0.5 wt. % of polyethylenedioxythiophene which polystyrenesulphonate is doped to and silicon alkoxide of below 10 wt. %, and also may contain 40–90 wt. % of at least one a selected from a group consisting of a methanol, an ethanol, an isopropanol, a butanol, and combinations thereof, 5–70 wt. % of pure water, and 1–20 wt. % of at least one co-solvent selected from a group consisting of a compound having a carbonyl group, an ether, and combinations thereof.

16 Claims, 3 Drawing Sheets

GLASS PLATE HAVING ELECTRICALLY CHARGE-PREVENTIVE FILM OF CONDUCTIVE ORGANIC POLYMER, ITS MAKING METHOD, A SOLUTION FOR MAKING THE FILM, AND ITS MANUFACTURING METHOD

FIELD OF THE INVENTION

The present invention relates to a glass plate having electrically charge-preventive film of conductive organic polymer, its making method, a solution for making the film, and its manufacturing method. In detail, it relates to an anti-static film formed using electroconductive organic polymer on the surface of the glass plate, particularly, an image display faceplate or a screen portion in a panel of a CRT 1 so as to improve the electrically charge-preventive so anti-static characteristics of the glass plate, such as the image display faceplate.

Recently, a wide use of an anti-explosion type cathode ray tube allows a face cover glass to be unnecessary in a television receiver, a monitor, etc., regarding the prevention of electrostatic charge, thereby exposing the front portion of the cathode ray tube, and giving electric shock by charged electrical high voltage, to the person who comes access, to the faceplate of the cathode ray tube. Furthermore, dust in air, particles, etc., are adhered to by the electric force, and accumulated on, the charged faceplate of the cathode ray tube, thereby having the image on the display faceplate difficult to see.

The cause of electrostatic charge as to the faceplate panel as one example of the glass plate is as follows.

A thin and uniform aluminium film is deposited by vacuum on the phosphor screen structure on the interior surface of the faceplate panel. When a electric power is applied to, a high anode voltage is applied to the aluminium film. Electric charges generate on the exterior surface wall of the panel by electrostatic induction due to the high voltage of the inside aluminium film.

Korean patent publication No. 2713 as one prior arts for providing an anti-static characteristics on the image display faceplate describes one such anti-static coating formed by the steps of preparing a slurry by mixing an alcohol solution containing alkoxysilane $Si(OR)_4$ (R is an alkyl group) and at least one of tin oxide, indium oxide and antimony oxide, spraying the slurry on the faceplate panel, and heat-treating the sprayed panel at a relatively low temperature.

U.S. Pat. No. 5,750,054, issued to Patrizia Cinquina, Vasto, et al. on May 12, 1998, discloses an anti-static, anti-glare coating for a reflective-transmissive surface wherein the surface is applied onto with a coating solution comprising a thiophene-based, electroconductive polymer and a siliceous material. As the concrete electroconductive polymer, polyethylenedioxythiophene, and as a siliceous material, lithium-stabilized silica sol and tetraethoxysilane are disclosed.

Further, U.S. Pat. No. 5,742,119 issued to Aben, et al. on Apr. 21, 1998, discloses a display screen of a cathode ray tube provided with an electroconductive coating of poly-3, 4-ethylenedioxythiophene. The coating layer has a sheet resistance of 1 kilo-ohm/quadrature and a high transmission. The layer provides an effective shield against electromagnetic radiation. The coating can be provided with additional layers of, for example, silicon dioxide to improve the mechanical properties.

However, the metallic oxide costs too much, thereby making the manufacturing cost very high.

Further, the problem is that while the metallic oxide exists dispersedly in the alcohol solution, deposition problem arises due to cohesion between the particles according the condition of the surroundings, thereby making spots or unevenness and lowering the electroconductivity.

Accordingly, it is one object of the present invention to provide a glass plate such as image display faceplate having high-electroconductive film which can be formed using electroconductive organic polymer in a simple method and at a low cost, and have an improved anti-static characteristic with a strong film hardness and a strong adhesive strength. Also, the present invention provides a method of making such film, said method comprising the steps of obtaining a anti-static layer by dissolving in alcohol an aqueous solution of electroconductive organic polymers and applying the resultant dissolved solution, and then spin overcoating an alcoholic solution of silicon alkoxide and heat-treating the resultant overcoated film. If necessary, an additional anti-glare layer may be further formed by spraying the alcoholic solution of silicon alkoxide onto the anti-static layer or the resultant film of the alcoholic solution of silicon alkoxide.

SUMMARY OF THE INVENTION

To accomplish the aforementioned purpose, the present invention provides a glass plate on which an anti-static film is formed on the exterior surface, said film comprising a first coating layer formed containing an electroconductive organic polymeric component and a second coating layer of silica coating formed by being overcoated onto the first coating layer.

Said first coating layer may be formed by coating an electroconductive organic polymeric solution containing 0.005–0.5 wt. % of polyethylenedioxythiophene which polystyrenesulphonate is doped to and silicon alkoxide of below 10 wt. %, and said electroconductive organic polymeric solution may contain 40–90 wt. % of at least one alcoholic solvent selected from a group consisting of a methanol, an ethanol, an isopropanol, a butanol, and combinations thereof, 5–70 wt. % of pure water, and 1–20 wt. % of at least one co-solvent selected from a group consisting of a compound having a carbonyl group, an ether, and combinations thereof. And, said second coating layer is formed by overcoating with alkoxysilane $Si(OR)_4$.

The anti-static film may have an anti-glare characteristic itself, and otherwise at least one anti-glare film formed thereon. Such glass plate may be an image display faceplate or a screen portion in a panel of a CRT.

Also, the present invention provides a method of forming a anti-static film on a surface of a glass plate, the method comprising the steps of: first-coating an electroconductive organic polymeric solution on the surface of the glass plate, said solution containing 0.005–0.5 wt. % of polyethylenedioxythiophene which polystyrenesulphonate is doped to and silicon alkoxide of below 10 wt. %; and second-coating alkoxysilane $Si(OR)_4$ after the first-coating step.

Furthermore, the present invention provides a solution for applying onto a surface of a glass plate in order to form an anti-static film, said solution containing 0.005–0.5 wt. % of polyethylenedioxythiophene which polystyrenesulphonate is doped to, silicon alkoxide of below 10 wt. %, 40–90 wt. % of at least one alcoholic solvent selected from a group consisting of a methanol, an ethanol, an isopropanol, a butanol, and combinations thereof, 5–70 wt. % of pure water, and 1–20 wt. % of at least one co-solvent selected from a group consisting of a compound having a carbonyl group, an ether, and combinations thereof.

It is preferred, in the electroconductivity, that said solution contain said silicon alkoxide of below 2 wt. %.

Furthermore, the present invention provides a method of making a solution for applying onto a surface of a glass plate in order to form an anti-static film, said solution being prepared by the steps of: dissolving in alcohol an aqueous solution of electroconductive organic polymers; first-adding silicon alkoxide to the alcoholic solution for improving the cohesive strength; and second-adding pure water and an inorganic acid catalyst for hydrolysis, and co-solvent for improving the application property.

The anti-static film formed by such method, comprises a first coating layer having fine porosities and an excellent electroconductive property, and a second coating layer formed by being overcoated with a material of a strong adhesive strength onto the first coating layer so as to adhere to at least the glass plate by penetrating through the porosities of the first coating layer, thus the anti-static film is adhered to the glass plate due to the strong adhesive strength without being scaled off and with obtaining an excellent electroconductive characteristic of the first coating layer.

BRIEF DESCRIPTION OF THE DRAWINGS

For a better understanding of the principle and nature of the present invention reference should be made to the following detailed description taken in connection with the accompanying drawings in which.

DETAILED DESCRIPTION OF THE PREFERRED EMBODIMENT

Figure 1:
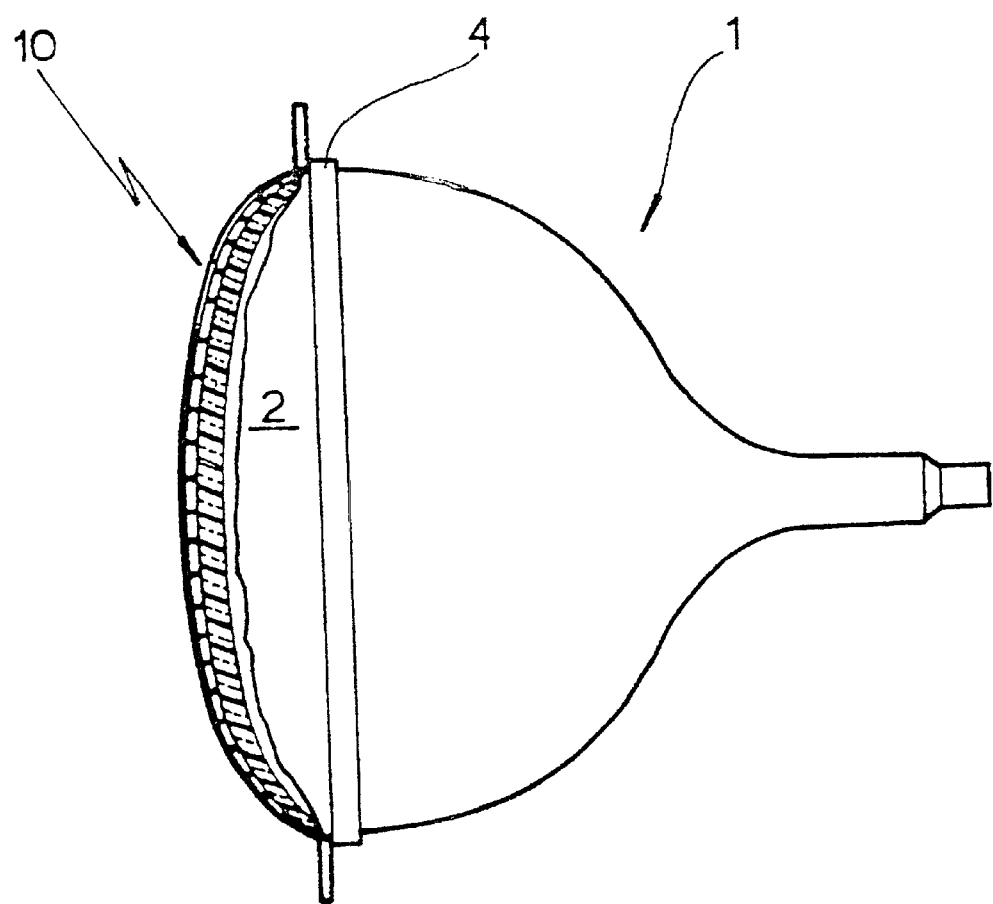
FIG. 1 is a schematical side view partially in axial section of a color cathode-ray tube, wherein an electroconductive organic polymeric anti-static film is formed on the exterior surface of a faceplate panel thereof according to one embodiment of the present invention.
Figure 2:
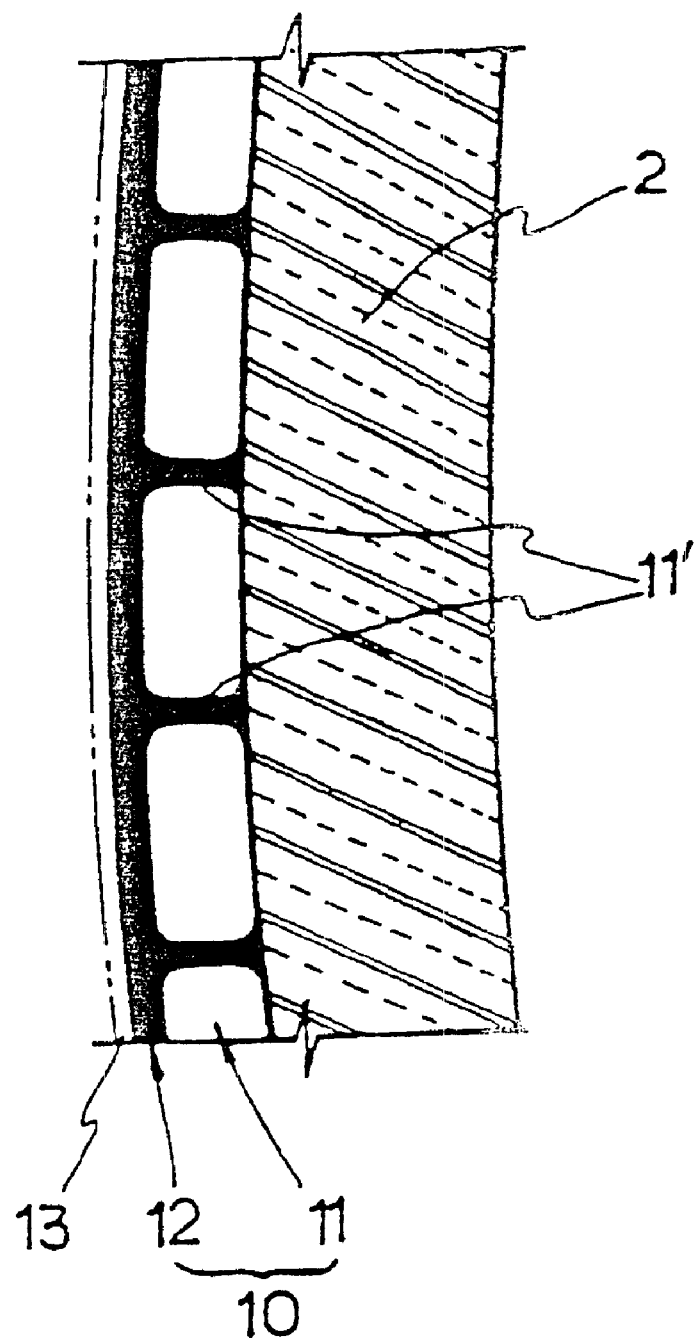
FIG. 2 is an enlarged sectional view of one portion in a panel in FIG. 1.

FIG. 1 and FIG. 2 show a color cathode ray tube as one example of an image display faceplate among a glass plate for an explanation of one embodiment of the present invention.

In FIG. 1, an electroconductive organic polymeric anti-static film 10 is formed on the exterior surface of a faceplate panel 2 in a color cathode ray tube 1. A grounded anti-explosion band 4 comes into contact with the anti-static film 10 and makes the potential of the overall surface of the anti-static film 10 zero, thereby preventing electrical charge.

In FIGS. 1 and 2, the anti-static film 10 according to the present invention comprises a first coating layer 11 formed containing an electroconductive organic polymeric component and a second coating layer 12 of silica coating formed by being overcoated onto the first coating layer 11, being characterizing in that the first coating layer 11 has fine porosities 11 ' and an excellent electroconductive property, and that the second coating layer 12 adheres to at least the glass plate 2' with a strong adhesive strength by penetrating through the porosities 11', 21' of the first coating layer 11, 21. Embodiments according to the present invention, using an electroconductive organic polymeric solution containing 0.005–0.5 wt. % of polyethylenedioxythiophene which polystyrenesulphonate is doped to as the organic polymer of the first coating layer 11, and using alkoxysilane $Si(OR)_4$ (R is an alkyl group as a solution for making said second coating layer 12, are explained as follows.

EXAMPLE 1

In FIGS. 1 and 2, the anti-static film 10 is formed according to the present invention as follows.

That is, an aqueous solution of polyethylenedioxythiophene(PEDT/PSS) which polystyrene sulphonate is doped to is dissolved in methanol. Sequently, ethylsilicate($Si(OC_2H_5)_4$) as an adhesive agent is added to the aqueous solution(PEDT/PSS aqueous solution), thereby the electroconductive solution being prepared. Then, pure water and an inorganic acid catalyst for hydrolysis, for example hydrochloric acid (HCl) are added, and dispersion agent is finally added, thus an electroconductive organic polymeric solutions prepared. Then, in an upward state of the exterior surface of the faceplate panel 2 of the color cathode ray tube 1, the color cathode ray tube 1 is rotated with around 130 rpm and the prepared solution is dropped on the exterior surface of the faceplate panel 2, thus a first coating layer 11 of a thin and uniform thickness is formed. This spin-coating is completed for about 1 minute 10 seconds. Following this spin-coating, a second coating layer 12 is formed by spin-coating alkoxysilane($Si(OR)_4$) on the first coating layer 11, thereby making the anti-static film 10 as shown in FIG. 2 with an excellent adhesion between the first coating layer 11 and the panel 2. This spin-coating is completed for about 1 minute 20 seconds. At the last time, the anti-static film 10 is baked at above about 150 degrees centigrade for 30 minutes, thereby the anti-static film 10 comprising the first coating layer 11 and the second coating layer 12 being completely formed.

The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
| --- | --- |
| PEDT/PSS | 0.30 wt. % |
| ETHYL SILICATE | 0.50 wt. % |
| ETHANOL | 60.19 wt. % |
| ISOPROPANOL | 10.00 wt. % |
| PURE WATER | 25.00 wt. % |
| HYDROCHLORIC ACID (HCl, 35%) | 0.01 wt. % |
| N-METHYL-2-PYRROLIDONE | 2.00 wt. % |
| ETHYL CELLOSOLVE | 2.00 wt. % |

In the result from the example above, the surface resistivity and the film hardness by means of a pencil test are as follows:

1. Surface resistivity: $9*10^3$ ohms/sq. ($\Omega/\square$)
2. Film hardness: 7H

EXAMPLE 2

The coating method is the same as that in EXAMPLE 1, but in the electroconductive organic polymeric solution, the content of ethylsilicate is increased for improving the film hardness; and diacetonealcohol is added for improving the application characteristics. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
|---|---|
| PEDT/PSS | 0.30 wt. % |
| ETHYL SILICATE | 1.00 wt. % |
| ETHANOL | 57.69 wt. % |
| ISOPROPANOL | 10.00 wt. % |
| PURE WATER | 25.00 wt. % |
| HYDROCHLORIC ACID (HCl, 35%) | 0.01 wt. % |
| N-METHYL-2-PYRROLIDONE | 2.00 wt. % |
| ETHYL CELLOSOLVE | 2.00 wt. % |
| DIACETONEALCOHOL | 2.00 wt. % |

In the result from the example above, the surface resistivity and the film hardness by means of a pencil test are as follows:

1. Surface resistivity: $44*10^4$ ohms/sq.
2. Film hardness: 8H

EXAMPLE 3

The coating method is the same as that in EXAMPLE 1, but in the electroconductive organic polymeric solution, the content of PEDT/PSS is increased for improving the electroconductivity, and methylethylketone (MEK is added as a co-solvent for lowering the surface tension of the solution and improving the application characteristics. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
|---|---|
| PEDT/PSS | 0.50 wt. % |
| ETHYL SILICATE | 0.50 wt. % |
| ETHANOL | 57.99 wt. % |
| ISOPROPANOL | 10.00 wt. % |
| PURE WATER | 25.00 wt. % |
| HYDROCHLORIC ACID (HCl, 35%) | 0.01 wt. % |
| ETHYL CELLOSOLVE | 3.00 wt. % |
| MEK (METHYLETHYLKETONE) | 3.00 wt. % |

In the result from the example above, the surface resistivity and the film hardness by means of a pencil test are as follows:

1) Surface resistivity: $8*10^3$ ohms/sq.
2) Film hardness: 7H

EXAMPLE 4

The coating method is the same as that in EXAMPLE 1, but instead of ethyl silicate as a solvent in the electroconductive organic polymeric solution, butanol is used. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
|---|---|
| PEDT/PSS | 0.30 wt. % |
| ETHANOL | 60.70 wt. % |
| BUTANOL | 10.00 wt. % |
| PURE WATER | 25.00 wt. % |
| PROPYLENE GLYCOL MONO METHYL ESTER | 2.00 wt. % |
| ETHYL CELLOSOLVE | 2.00 wt. % |

In the result from the example above, the surface resistivity and the film hardness by means of a pencil test are as follows:

1) Surface resistivity: $4*10^3$ ohms/sq.
2) Film hardness: 6H

EXAMPLE 5

The coating method is the same as that in EXAMPLE 1, but in the electroconductive organic polymeric solution, a solvent and a co-solvent are changed for improving the electroconductivity. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
|---|---|
| PEDT/PSS | 0.30 wt. % |
| ETHYL SILICATE | 0.50 wt. % |
| ETHANOL | 58.19 wt. % |
| METHANOL | 10.00 wt. % |
| PURE WATER | 25.00 wt. % |
| HYDROCHLORIC ACID (HCl, 35%) | 0.01 wt. % |
| N-METHYL-2-PYRROLIDONE | 2.00 wt. % |
| BUTYL CELLOSOLVE | 2.00 wt. % |
| ETHYL CELLOSOLVE | 2.00 wt. % |

In the result from the example above, the surface resistivity and the film hardness by means of a pencil test are as follows:

1) Surface resistivity: $8*10^3$ ohms/sq.
2) Film hardness: 7H

EXAMPLE 6

The coating method is the same as that in EXAMPLE 1, but in the electroconductive organic polymeric solution, a content of pure water, and a solvent and a co-solvent are changed for improving the application characteristic. The constituents and the contents of the electroconductive organic polymeric solution or forming the first coating layer 11 are as follows:

| CONSTITUENTS OF THE ELECTRO-CONDUCTIVE ORGANIC POLYMERIC SOLUTION | CONTENT (wt. %) |
|---|---|
| PEDT/PSS | 0.30 wt. % |
| ETHYL SILICATE | 0.50 wt. % |
| ETHANOL | 58.19 wt. % |
| METHANOL | 3.00 wt. % |
| ISOPROPYL ALCOHOL | 17.00 wt. % |
| PURE WATER | 15.00 wt. % |
| HYDROCHLORIC ACID (HCl, 35%) | 0.01 wt. % |
| N-METHYL-2-PYRROLIDONE | 2.00 wt. % |
| BUTYL CELLOSOLVE | 2.00 wt. % |
| ETHYL CELLOSOLVE | 2.00 wt. % |

In the result from the example above, the surface resistivity and the film hardness by means of a pencil test are as follows:

1) Surface resistivity: $1*10^4$ ohms/sq.
2) Film hardness: 7H

EXAMPLE 7

The coating method is the same as that in EXAMPLE 1, but in the electroconductive organic polymeric solution, contents of pure water and ethylsilicate, and a solvent and a co-solvent are changed. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
| --- | --- |
| PEDT/PSS | 0.30 wt. % |
| ETHYL SILICATE | 0.40 wt. % |
| ETHANOL | 58.29 wt. % |
| METHANOL | 10.00 wt. % |
| ISOPROPYL ALCOHOL | 10.00 wt. % |
| PURE WATER | 15.00 wt. % |
| HYDROCHLORIC ACID (HCl, 35%) | 0.01 wt. % |
| N-METHYL-2-PYRROLIDONE | 2.00 wt. % |
| PROPYLENE GLYCOL MONO METHYL ESTER | 2.00 wt. % |
| ETHYL CELLOSOLVE | 2.00 wt. % |

In the result from the example above, the surface resistivity and the film hardness by means of a pencil test are as follows:

1) Surface resistivity: $6*10^3$ ohms/sq.
2) Film hardness: 7H

EXAMPLE 8

The coating method is the same as that in EXAMPLE 1, but in the electroconductive organic polymeric solution, a content of PEDT/PSS is decreased. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
| --- | --- |
| PEDT/PSS | 0.10 |
| ETHYL SILICATE | 0.50 |
| ETHANOL | 70.39 |
| ISOPROPANOL | 10.00 |
| PURE WATER | 15.00 |
| HYDROCHLORIC ACID (HCl, 35%) | 0.01 |
| N-METHYL-2-PYRROLIDONE | 2.00 |
| ETHYL CELLOSOLVE | 2.00 |

In the result from the example above, the surface resistivity and the film hardness by means of a pencil test are as follows:

1) Surface resistivity: $1*10^5$ ohms/sq.
2) Film hardness: 8H

EXAMPLE 9

The coating method is the same as that in EXAMPLE 1, but in the electroconductive organic polymeric solution, a content of PEDT/PSS is remarkably decreased. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
| --- | --- |
| PEDT/PSS | 0.005 |
| ETHYL SILICATE | 0.50 |
| ETHANOL | 80.485 |
| ISOPROPANOL | 10.00 |
| PURE WATER | 5.00 |
| HYDROCHLORIC ACID (HCl, 35%) | 0.01 |
| N-METHYL-2-PYRROLIDONE | 2.00 |
| ETHYL CELLOSOLVE | 2.00 |

In the result from the example above, the surface resistivity and the film hardness by means of a pencil test are as follows:

1) Surface resistivity: $3*10^6$ ohms/sq.
2) Film hardness: 8H

EXAMPLE 10

The coating method is the same as that in EXAMPLE 1, but in the electroconductive organic polymeric solution, a content of PEDT/PSS is extremely decreased. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
| --- | --- |
| PEDT/PSS | 0.001 |
| ETHYL SILICATE | 0.50 |
| ETHANOL | 80.489 |
| ISOPROPANOL | 10.00 |
| PURE WATER | 5.00 |
| HYDROCHLORIC ACID (HCl, 35%) | 0.01 |
| N-METHYL-2-PYRROLIDONE | 2.00 |
| ETHYL CELLOSOLVE | 2.00 |

In the result from the example above, the surface resistivity and the film hardness by means of a pencil test are as follows:

1) Surface resistivity: $4*10^3$ ohms/sq.
2) Film hardness: 8H

EXAMPLE 11

The coating method is the same as that in EXAMPLE 1, but in the electroconductive organic polymeric solution, a content of PEDT/PSS is remarkably increased. The constituents and the contents of the electroconductive organic polymeric solution for forming the first coating layer 11 are as follows:

| CONSTITUENTS OF THE ELECTRO-CONDUCTIVE ORGANIC POLYMERIC SOLUTION | CONTENT (wt. %) |
| --- | --- |
| PEDT/PSS | 0.65 |
| ETHYL SILICATE | 0.50 |
| ETHANOL | 31.84 |
| ISOPROPANOL | 10.00 |
| PURE WATER | 53.00 |

-continued

| CONSTITUENTS OF THE ELECTRO-CONDUCTIVE ORGANIC POLYMERIC SOLUTION | CONTENT (wt. %) |
|---|---|
| HYDROCHLORIC ACID (HCl, 35%) | 0.01 |
| N-METHYL-2-PYRROLIDONE | 2.00 |
| ETHYL CELLOSOLVE | 2.00 |

In the result from the example above, the surface resistivity and the film hardness by means of a pencil test are as follows:
1) Surface resistivity: $6*10^3$ ohms/sq.
2) Film hardness: 5H As found from the above-described Examples 1 to 11, within the scope of the appended claims according to the present invention, it is realized to form, on the image display faceplate, the anti-static film 10 comprising a first coating layer 11 of high-electroconductivity containing an electroconductive organic polymeric component. And, when the minimum of the ethyl silicate, i.e., only a binder is contained in the electroconductive first coating layer 11, the electroconductivity can be maximized.

That is, compared with the examples 1 to 7 and 11, the examples 8, 9 and 10 shows the very high surface resistivity, thereby conspicuously lowering the electroconductivity. Particularly, in less than 0.005 wt. % of PEDT/PSS as shown in the example 10, the electroconductivity becomes abruptly lowered, while, PEDT/PSS of above 0.005 wt. % is contained as shown in the example 11, the spin coating is difficult(the application characteristics become lowered and the film hardness becomes remarkably lowered due to the increase of the viscosity. Therefore, the content of PEDT/PSS between 0.1 to 0.3 wt. % is found to be proper as an electroconductive organic polymeric anti-static film for the image display faceplate.

Furthermore, the alkoxysilane solution is overcoating on the first coating layer 11 and permeated in the firs coating layer 11, thereby making the silica film on the panel 2 and increasing the sticking strength. Therefore, the first coating layer 11 becomes strongly attached to the panel 2 and the film hardness increased.

Thus, the anti-static film 10 having an excellent shield effect' against electromagnetic radiation and the superior anti-static characteristics can be obtained. Further, compared with the conventional metallic oxide coating, the manufacturing cost of the anti-static film 10 according to the present invention becomes lowered and its method simpler. Also, deposition problem was not found, thereby making the coating on the exterior surface of the faceplate even without any spots. The reason is understood to be that the solution used in the present invention does not comprise any inorganic slurry.

Figure 3:
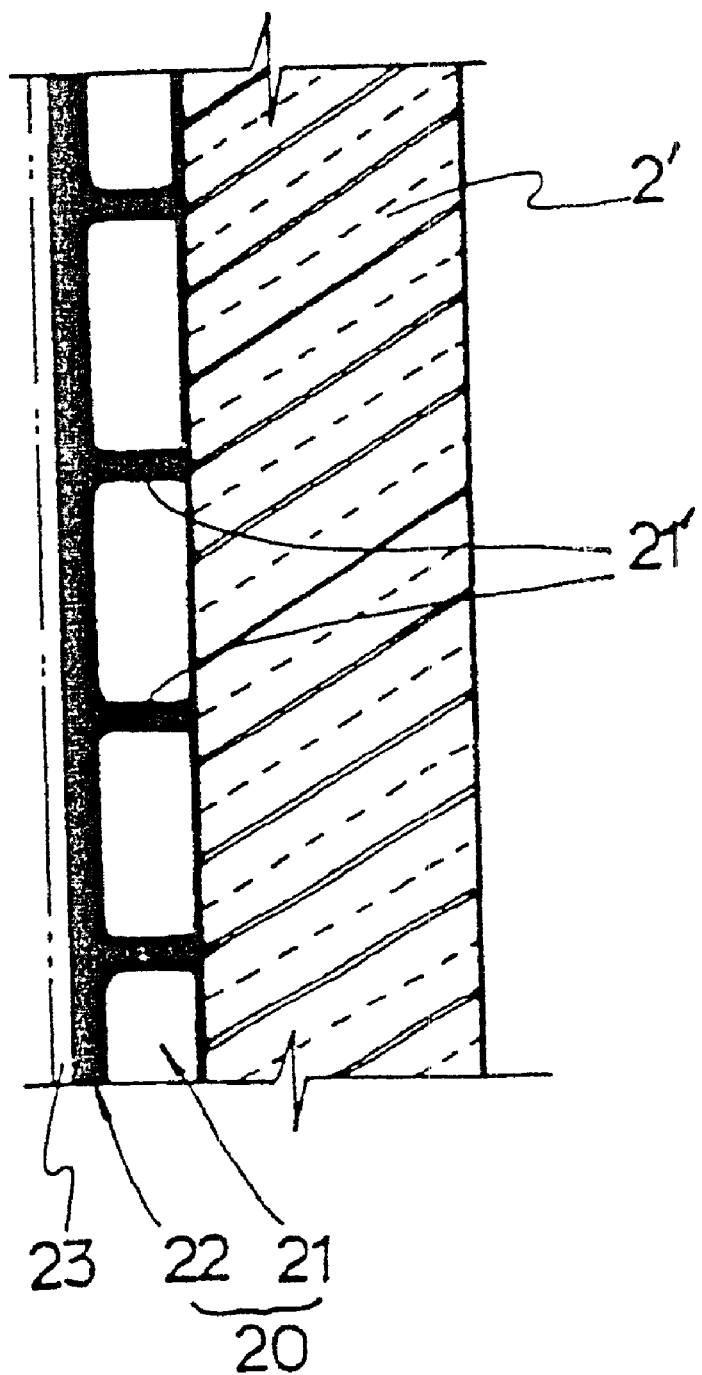
FIG. 3 is an enlarged sectional view similar to FIG. 2, showing an electroconductive organic polymeric anti-static film formed on a general glass plate according to another embodiment of the present invention.

FIG. 3 is an enlarged sectional view similar, in part, showing an electroconductive organic polymeric anti-static film 20 formed on a general glass plate 2' according to another embodiment of the present invention by means of the forementioned method.

In FIG. 3, the anti-static film 20 comprises a first coating layer 21 formed containing an electroconductive organic polymeric component and a second coating layer 22 of silica coating formed by being overcoated onto the first coating layer 21, said anti-static film 20 having fine porosities 21', as shown in FIG. 2. That is, the anti-static film 20 comprises the first coating layer 21 having fine porosities 21' with an excellent electroconductivity, and the second coating layer 22 penetrates through the porosities 21' of the first coating layer 21 when overcoated on the first coating layer 21, thereby being adhered to at least the surface of the glass plate 2'. Therefore, the second coating layer 22 is very high in the film hardness and the adhesive strength.

In examples for the glass plate 2', using an electroconductive organic polymeric solution containing 0.005–0.5 wt. % of polyethylenedioxythiophene which polystyrenesulphonate is doped to as the organic polymer of the first coating layer 21, and using alkoxysilane Si(OR4(R is an alkyl group as a solution for making said second coating layer 12, and similar to the above-described examples for the panel 2, the coating structure of the electroconductive organic polymeric film is formed as shown in FIG. 3, and each surface resistivity and each film hardness in the pencil test are similar to those in each examples above for the panel 2.

Therefore, except for an image display faceplate, the anti-static film 20 can be used for the general glass plate in which the anti-static characteristic is required like a monitor protective cover and also, for the shield effect against electromagnetic radiation or the anti-reflective effect.

Meanwhile, an anti-reflective layer 23 can be formed even in this embodiment for a more effective anti-reflection as shown in phantom line in FIG. 3.

As understood from the above-described embodiments, the present invention enables an anti-static coating on a general glass plate having high electroconductivity or superior anti-static characteristics, very high sticking strength and film hardness, etc., and at the lower manufacturing cost and in the simple manufacturing method. It should be clear to one skilled in the art that the present invention can be altered and applied without any limitation to the aforementioned embodiments of the present invention and within the scope of the present invention's spirit.

What is claimed is:

1. A solution for applying onto a surface of a glass plate 2' in, order to form an anti-static film (10, 20), said solution containing 0.005–0.5 wt. % of polyethylenedioxythiophene which polystyrenesulphonate is doped to, silicon alkoxide of below 10 wt. %, 40–90 wt. % of at least one alcoholic solvent selected from a group consisting of a methanol, an ethanol, an isopropanol, a butanol, and combinations thereof, 5–70 wt. % of pure water, and 1–20 wt. % of at least one co-solvent selected from a group consisting of a compound having a carbonyl group, an ether, and combinations thereof.

2. A solution according to claim 1, wherein said silicon alkoxide is of below 2 wt. %.

3. A method of making a solution for applying onto a surface of a glass plate (2') in order to form an anti-static film (10, 20), said solution being prepared by the steps of:
   dissolving in alcohol an aqueous solution of electroconductive organic polymers;
   first-adding silicon alkoxide to the alcoholic solution for improving the cohesive strength; and
   second-adding pure water and an inorganic acid catalyst for hydrolysis, and co-solvent for improving the application property.

4. A method according to claim 3, wherein said alcoholic solvent is of 40–90 wt. % and selected from a group consisting of a methanol, an ethanol, an isopropanol, a butanol, and combinations thereof, wherein said electroconductive organic polymer is 0.005–0.5 wt. % of polyethylenedioxythiophene which polystyrenesulphonate is doped to, wherein silicon alkoxide is of below 10 wt. %, and wherein said co-solvent is of 1–20 wt. % and is selected from a group consisting of a compound having a carbonyl group, an ether, and combinations thereof.

5. A glass plate on which an anti-static film (10, 20) is formed on the exterior surface, said film comprising:

a first coating layer (11, 21), formed by coating an electroconductive organic polymeric solution containing 0.005–0.5 wt. % of polyethylenedioxythiophene which polystyrenesulphonate is doped to, silicon alkoxide of below 10 wt. %; and a second coating layer (12, 22) of silica coating, formed by being overcoated onto the first coating layer (11, 21).

6. A glass plate according to claim 5, wherein said electroconductive organic polymeric solution contains 40–90 wt. % of at least one alcoholic solvent selected from a group consisting of a methanol, an ethanol, an isopropanol, a butanol, and combinations thereof, 5–7 wt. % of pure water, and 1–20 wt. %. of at least one co-solvent selected from a group consisting of a compound having a carbonyl group, an ether, and combinations thereof.

7. A glass plate according to claim 5, wherein said second coating layer (12, 22) is formed by coating with alkoxysilane $Si(OR)_4$ (R is an alkyl group).

8. A glass plate according to claim 5, wherein said anti-static film (10, 20) has an anti-glare characteristic itself, and otherwise at least one anti-glare film (13, 23) formed thereon.

9. A glass plate according to claim 5, wherein said glass plate includes an image display faceplate or a screen portion in a panel of a CRT (1).

10. A glass plate on which an anti-static film (10, 20) is formed on the exterior surface, said film comprising:

a first coating layer (11, 21) having fine porosities (11', 21') and an excellent electroconductive property formed by spin-coating an electroconductive organic polymeric solution containing 0.005–0.05 wt % of polyethylenedioxythiophene which polystyrenesulphonate is doped to and silicon alkoxide of below 10 wt. %; and a second coating layer (12, 22) formed by being overcoated with a material of a strong adhesive strength onto the first coating layer (11, 21) so as to adhere to at least the glass plate (2') by penetrating through the porosities (11', 21') of the first coating layer (11, 21).

11. A glass plate according to claim 10, wherein said second coating layer (12, 22) is formed by coating with alkoxysilane $Si(OR)_4$ (R is an alkyl group).

12. A glass plate according to claim 10, wherein said glass plate includes an image display faceplate or a screen portion in a panel of CRT (1).

13. A method of forming an anti-static film (10, 20) on a surface of a glass plate (2'), the method comprising the steps of:

first-coating an electroconductive organic polymeric solution on the surface of the glass plate 2', said solution containing 0.005–0.5 wt. % of polyethylenedioxythiophene which polystyrenesulphonate is doped to and silicon alkoxide of below 10 wt. %; and second-coating alkoxysilane $Si(OR)_4$ after the first-coating step.

14. A method according to claim 13, wherein said electroconductive organic polymeric solution contains 40–90 wt. % of at least one alcoholic solvent selected from a group consisting of a methanol, an ethanol, and isopropanol, a butanol, and combinations thereof, 5–70 wt. % of pure water, and 1–20 wt. % of at least one co-solvent selected from a group consisting of a compound having a carbonyl group, an ether, and combinations thereof.

15. A method according to claim 13, wherein the anti-static film (10, 20) is formed by-heat-treating the applied glass at a temperature of 180 degrees centigrade after the second-coating step.

16. A method according to claim 13, wherein the first-coating step and the second-coating step are performed by one coating method selected from a spin-coating, spraying, dipping, and combinations thereof.

\* \* \* \* \*